US010748790B2

(12) United States Patent
Suzuki et al.

(10) Patent No.: US 10,748,790 B2
(45) Date of Patent: Aug. 18, 2020

(54) SUBSTRATE PROCESSING APPARATUS AND SUBSTRATE PROCESSING METHOD

(71) Applicant: TOKYO ELECTRON LIMITED, Minato-ku (JP)

(72) Inventors: Hiroyuki Suzuki, Koshi (JP); Takashi Yabuta, Koshi (JP); Jun Nonaka, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 0 days.

(21) Appl. No.: 15/907,394

(22) Filed: Feb. 28, 2018

(65) Prior Publication Data

US 2018/0254199 A1  Sep. 6, 2018

(30) Foreign Application Priority Data

Mar. 1, 2017  (JP) ................... 2017-038322

(51) Int. Cl.
H01L 21/67 (2006.01)
H01L 21/687 (2006.01)
H01L 21/306 (2006.01)
H01L 21/02 (2006.01)

(52) U.S. Cl.
CPC .... H01L 21/6708 (2013.01); H01L 21/02057 (2013.01); H01L 21/30604 (2013.01); H01L 21/67028 (2013.01); H01L 21/67051 (2013.01); H01L 21/67253 (2013.01); H01L 21/68764 (2013.01)

(58) Field of Classification Search
None
See application file for complete search history.

(56) References Cited

U.S. PATENT DOCUMENTS

2007/0175501 A1* 8/2007 Amai ................ B08B 1/04
                                                134/149
2008/0041420 A1* 2/2008 Sekiguchi .......... B08B 3/02
                                                134/18
2009/0004876 A1* 1/2009 Koyata ............ H01L 21/02019
                                                438/753

(Continued)

FOREIGN PATENT DOCUMENTS

JP  2015-103656 A  6/2015

Primary Examiner — Sylvia MacArthur
(74) Attorney, Agent, or Firm — Oblon, McClelland, Maier & Neustadt, L.L.P.

(57) ABSTRACT

A substrate processing apparatus includes a holding device that holds a substrate horizontally, a rotation device that rotates the holding device such that the substrate held by the holding device is rotated, a supply device that includes a nozzle and supplies etching liquid from the nozzle to the substrate held by the holding device, a movement device that moves the nozzle with respect to the substrate held by the holding device, and a control device including circuitry that executes a scan process in which the circuitry controls the rotation, movement and supply devices such that while the liquid is supplied from the nozzle to the substrate, the nozzle is moved back and forth over the substrate between first and second positions on outer peripheral side of the substrate relative to the first position. The circuit of the control device executes the scan process multiple times while changing the first position.

10 Claims, 12 Drawing Sheets

(56) References Cited

U.S. PATENT DOCUMENTS

| | | | |
|---|---|---|---|
| 2015/0234285 A1* | 8/2015 | Takeishi | G03F 7/3021 |
| | | | 355/27 |
| 2016/0217997 A1* | 7/2016 | Takeishi | G05B 19/418 |
| 2017/0178892 A1* | 6/2017 | Sato | H01L 21/02057 |
| 2017/0186599 A1* | 6/2017 | Takahashi | H01L 21/02052 |
| 2017/0287769 A1* | 10/2017 | Ota | H01L 21/68742 |
| 2017/0323806 A1* | 11/2017 | Cheung | H01L 22/12 |
| 2018/0025922 A1* | 1/2018 | Tsujikawa | B08B 3/048 |
| | | | 134/26 |
| 2018/0254199 A1* | 9/2018 | Suzuki | H01L 21/67028 |

* cited by examiner

SUBSTRATE PROCESSING APPARATUS AND SUBSTRATE PROCESSING METHOD

CROSS-REFERENCE TO RELATED APPLICATIONS

The present application is based upon and claims the benefit of priority to Japanese Patent Application No. 2017-038322, filed Mar. 1, 2017, the entire contents of which are incorporated herein by reference.

BACKGROUND OF THE INVENTION

Field of the Invention

The present invention relates to a substrate processing apparatus and a substrate processing method.

Description of Background Art

Japanese Patent Laid-Open Publication No. 2015-103656 describes that an etching process of a substrate is performed by a continuous scan process between two positions. The entire contents of this publication are incorporated herein by reference.

SUMMARY OF THE INVENTION

According to one aspect of the present invention, a substrate processing apparatus includes a holding device that holds a substrate horizontally, a rotation device that rotates the holding device such that the substrate held by the holding device is rotated, a supply device that includes a nozzle and supplies an etching liquid from the nozzle to the substrate held by the holding device, a movement device that moves the nozzle of the supply device with respect to the substrate held by the holding device, and a control device including circuitry that executes a scan process in which the circuitry controls the rotation device, the movement device and the supply device such that while the etching liquid is supplied from the nozzle to the substrate being rotated by the rotation device, the nozzle is moved back and forth over the substrate between a first position and a second position on an outer peripheral side of the substrate relative to the first position. The circuit of the control device executes the scan process multiple times while changing the first position.

According to another aspect of the present invention, a substrate processing method includes horizontally holding a substrate with a holding device that holds the substrate horizontally, rotating the substrate held by the holding device with a rotation device that rotates the holding device, and continuously executing a scan process multiple times in which while an etching liquid is supplied from a nozzle of a supply device that supplies the etching liquid to the substrate rotated by the rotation device, a movement device that moves the nozzle with respect to the substrate held by the holding device moves the nozzle back and forth over the substrate between a first position and a second position that is on an outer peripheral side of the substrate relative to the first position, while changing the first position.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
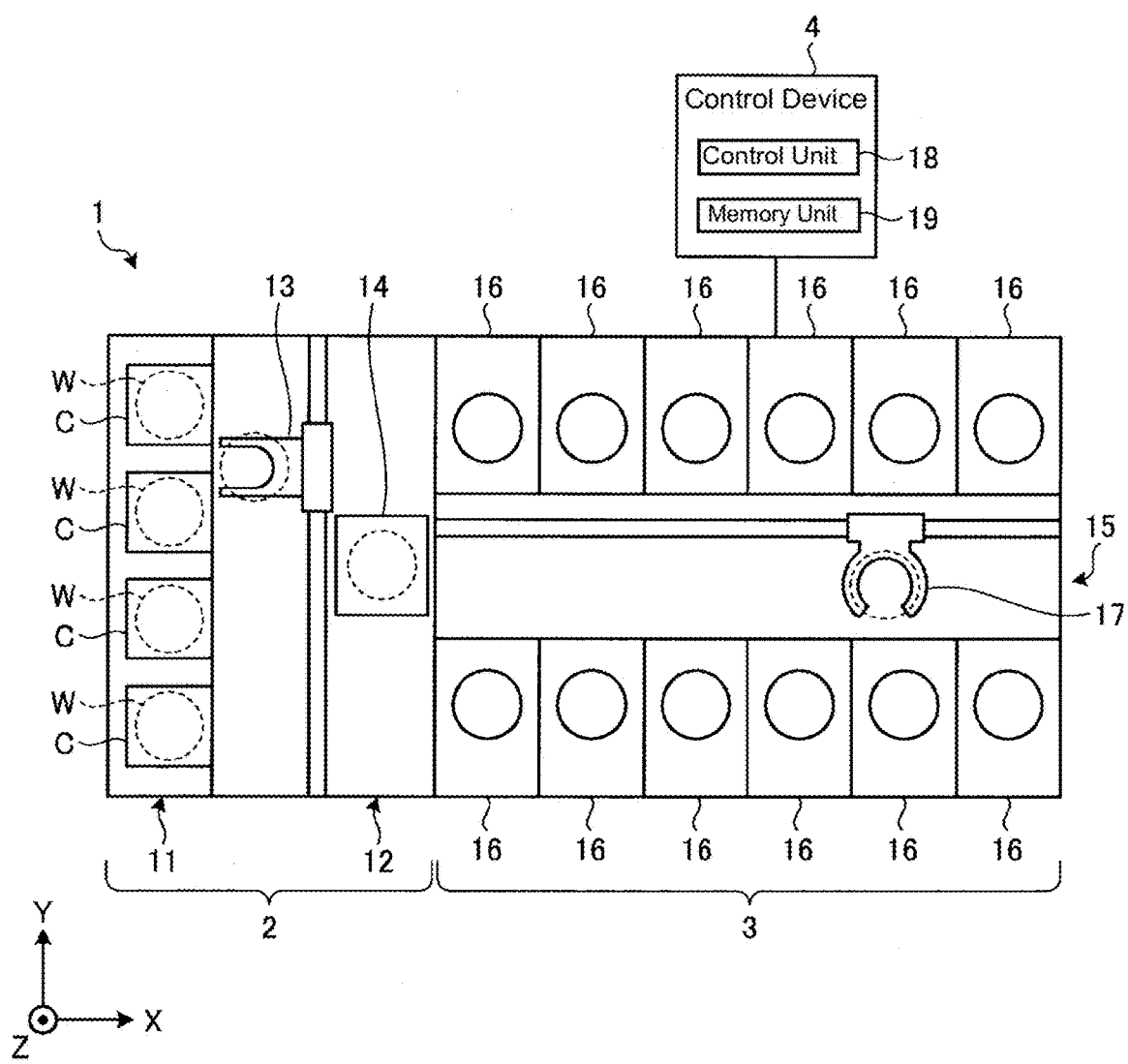
FIG. 1 illustrates a schematic structure of a substrate processing system according to an embodiment.

Embodiments will now be described with reference to the accompanying drawings, wherein like reference numerals designate corresponding or identical elements throughout the various drawings.

FIG. 1 is a view schematically showing the structure of a substrate processing system according to an embodiment of the present invention. In the following, X, Y and Z axes intersecting each other at right angles are specified to clarify positional relationships, and a positive direction of the Z axis is set as the vertically upward direction.

As shown in FIG. 1, substrate processing system 1 is provided with loading station 2 and processing station 3. Loading station 2 and processing station 3 are positioned to be adjacent to each other.

Loading station 2 includes carrier mounting zone 11 and transport zone 12. Multiple carriers (C), which horizontally accommodate multiple substrates—semiconductor wafers (hereinafter wafers (W)) in the present embodiment—are mounted in carrier mounting zone 11.

Transport zone 12 is positioned adjacent to carrier mounting zone 11, and is provided with substrate transport apparatus 13 and delivery table 14. Substrate transport apparatus 13 has a wafer holding mechanism for holding a wafer (W). Substrate transport apparatus 13 is capable of moving horizontally and vertically as well as rotating around the vertical axis, and transports a wafer (W) between a carrier (C) and delivery table 14 using the wafer holding mechanism.

Processing station 3 is positioned adjacent to transport zone 12. Processing station 3 includes transport zone 15 and multiple processing units 16. Multiple processing units 16 are aligned on each side of transport zone 15.

Substrate transport device 17 is provided in transport zone 15. Substrate transport device 17 includes a wafer holding mechanism for holding a wafer (W). In addition, substrate transport device 17 is capable of moving horizontally and vertically as well as rotating around the vertical axis, and transports a wafer (W) between delivery table 14 and processing unit 16 using the wafer holding mechanism.

Processing unit 16 conducts predetermined treatments on a wafer (W) transported by substrate transport device 17.

Substrate processing system 1 includes control device 4. Control device 4 is a computer, for example, and includes control unit 18 and memory unit 19. Memory unit 19 stores a program for controlling various treatments carried out in substrate processing system 1. Control unit 18 controls operations to be performed in substrate processing system 1 by reading out and executing the program stored in memory unit 19.

Such a program may be stored in a computer-readable medium and installed from the memory medium onto memory unit 19 of control device 4. Examples of a computer-readable medium are hard disks (HD), flexible disks (FD), compact discs (CD), magneto-optical discs (MO), memory cards and the like.

In substrate processing system 1 structured as above, first, substrate transport apparatus 13 of loading station 2 takes out a wafer (W) from carrier (C) in carrier mounting zone 11, and mounts the wafer (W) on delivery table 14. The wafer (W) mounted on delivery table 14 is unloaded by substrate transport device 17 of processing station 3 to be loaded into processing unit 16.

The wafer (W) loaded into processing unit 16 is treated in processing unit 16 and is unloaded from processing unit 16 by substrate transfer device 17 to be mounted onto delivery table 14. Then, the treated wafer (W) mounted on delivery table 14 is returned by substrate transport apparatus 13 to carrier (C) in carrier mounting zone 11.

Figure 2:
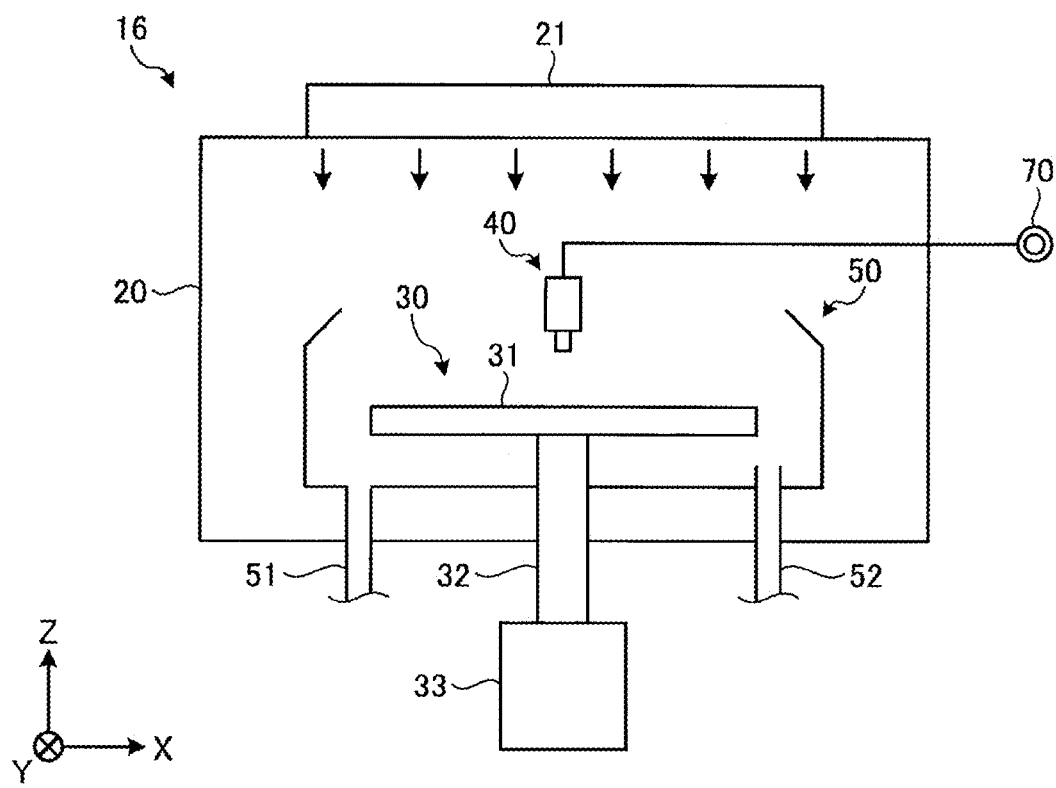
FIG. 2 illustrates a schematic structure of a processing unit.

The processing unit 16 is described with reference to FIG. 2. FIG. 2 illustrates a schematic structure of the processing unit 16.

As shown in FIG. 2, processing unit 16 is provided with chamber 20, substrate holding mechanism 30, processing liquid supply device 40 and collection cup 50.

Chamber 20 accommodates substrate holding mechanism 30, processing liquid supply device 40 and collection cup 50. Fan filter unit (FFU) 21 is installed on the ceiling of chamber 20. FFU 21 generates a downflow in chamber 20.

Substrate holding mechanism 30 is provided with holding device 31, support post 32, and driver device 33. Holding device 31 holds wafers (W) horizontally. Support post 32 is a member extending vertically with its base portion supported by driver device 33 so as to be rotatable, and horizontally supports holding device 31 at its top portion. Driver device 33 rotates support post 32 around the vertical axis. Substrate holding mechanism 30 structured as above rotates support post 32 using driver device 33 to rotate holding device 31 supported by support post 32. Accordingly, the wafer (W) held by holding device 31 is rotated.

Processing-liquid supply device 40 supplies a processing liquid to a wafer (W). Processing-liquid supply device 40 is connected to processing-liquid supply source 70.

Collection cup 50 is positioned to surround holding device 31, and collects the processing liquid scattered from a wafer (W) as holding device 31 rotates. Drain port 51 is formed at the bottom of collection cup 50, and the processing liquid collected in collection cup 50 is drained from drain port 51 to the outside of processing unit 16. In addition, exhaust port 52 is formed at the bottom of collection cup 50 so that the gas supplied from FFU 21 is exhausted to the outside of processing unit 16.

The processing unit 16 corresponds to an example of a substrate processing apparatus. In a first embodiment, as an example, a case is described where the processing unit 16 is used to performed an etching process in which foreign substances attached to a polysilicon film formed on a surface of the wafer (W) are removed by supplying an etching liquid to the polysilicon film.

Structural Example of Processing Unit

Figure 3:
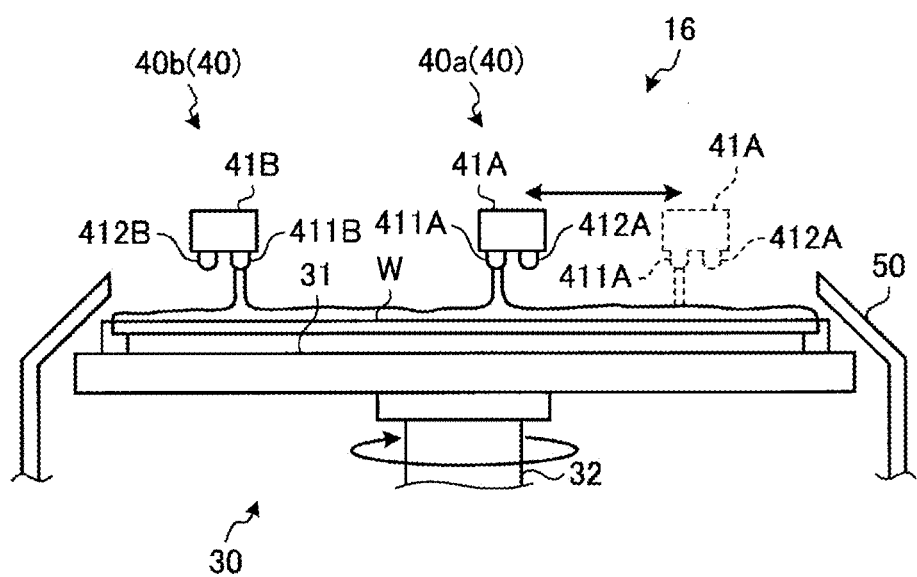
FIG. 3 is an enlarged view schematically illustrating a region near a wafer held by a holding device of the processing unit illustrated in FIG. 2.

FIG. 3 is an enlarged view schematically illustrating a region near the wafer (W) held by the holding device 31 of the processing unit 16 illustrated in FIG. 2. Further, FIG. 4 is a schematic plan view of the processing unit 16.

As illustrated in FIG. 3, in the processing unit 16, a main nozzle device (40a) that supplies an etching liquid to the entire surface of the wafer (W), and a secondary nozzle device (40b) for adjusting a temperature distribution formed in the surface of the wafer (W) by the etching liquid supplied from the main nozzle device (40a) are provided.

The main nozzle device (40a) includes a nozzle head (41A), an etching nozzle (411A) that is provided in the nozzle head (41A) and supplies an etching liquid to the wafer (W), and a rinse nozzle (412A) that is provided in the nozzle head (41A) and supplies a rinse liquid. As illustrated in FIG. 3, these nozzles (411A, 412A) respectively linearly discharge the processing liquids (the etching liquid, the rinse liquid) vertically downward.

Figure 4:
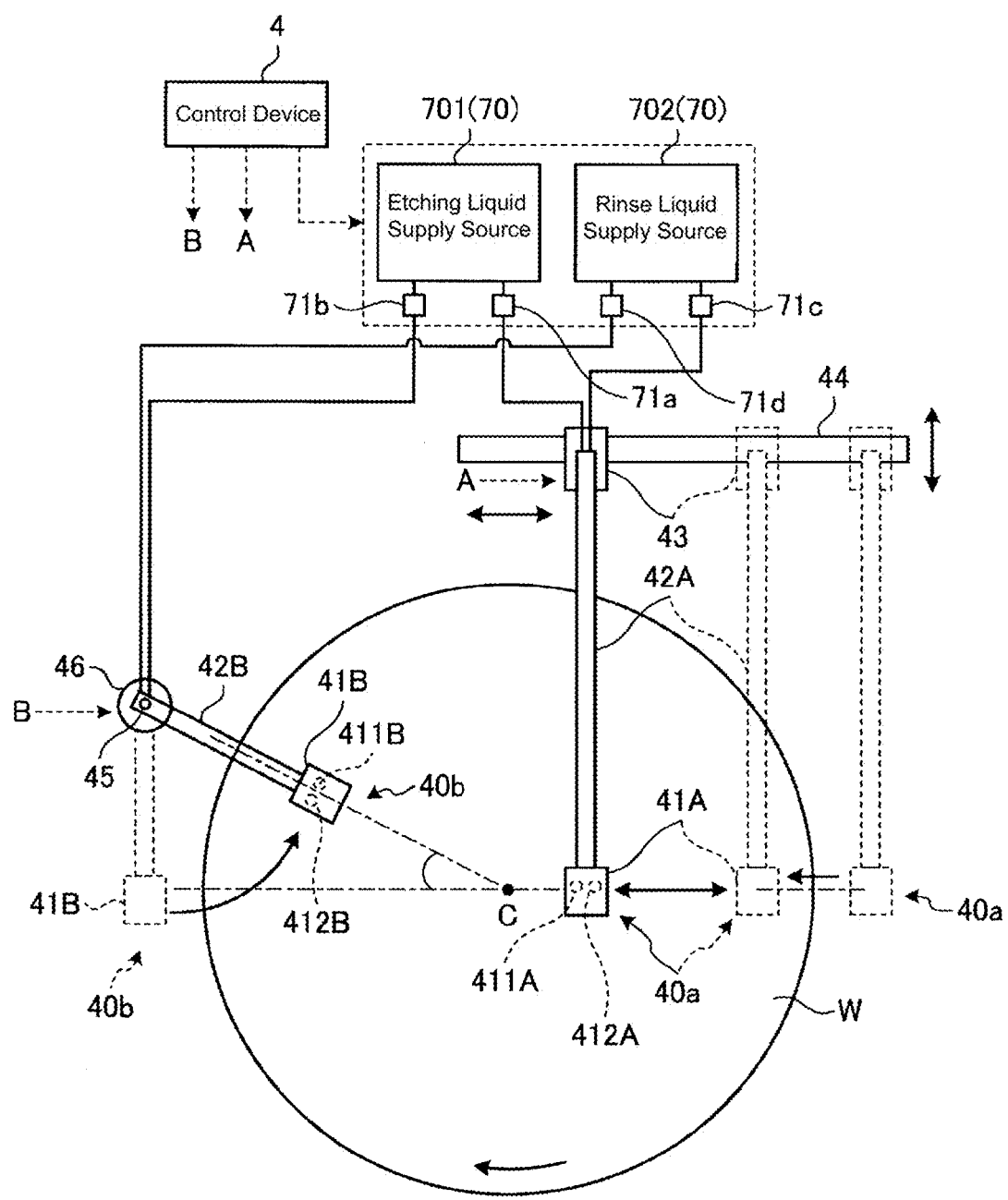
FIG. 4 is a schematic plan view of the processing unit.

As illustrated in FIG. 4, the nozzle head (41A) of the main nozzle device (40a) is provided on a front end part of a nozzle arm (42A) extending along the wafer (W) held by the holding device 31, and is positioned above an upper surface (surface to be treated) of the wafer (W). A base end part of the nozzle arm (42A) is supported by a slider 43 that is freely movable on a guide rail 44, and, by moving the slider 43 on the guide rail 44, the main nozzle device (40a) can be freely moved in a horizontal direction along a radial direction of the wafer (W). Further, the main nozzle device (40a) can also move to a standby position retracted from above the wafer (W) to one side.

The slider 43 is an example of a movement mechanism for moving the etching nozzle (411A). Without being limited to the structure illustrated in FIG. 4, the movement mechanism of the etching nozzle (411A) may also be structured to include a swinging mechanism for swinging the nozzle arm (42A) and the nozzle head (41A).

The secondary nozzle device (40b) includes a nozzle head (41B), an etching nozzle (411B) that is provided in the nozzle head (41B) and supplies an etching liquid to the wafer (W), and a rinse nozzle (412B) that is provided in the nozzle head (41B) and supplies a rinse liquid. As illustrated in FIG. 3, these nozzles (411B, 412B) respectively linearly discharge the processing liquids (the etching liquid, the rinse liquid) vertically downward.

The nozzle head (41B) of the secondary nozzle device (40b) is provided on a front end part of a nozzle arm (42B) extending along the wafer (W) held by the holding device 31, and is positioned above the wafer (W). As illustrated in FIG. 4, a base end part of the nozzle arm (42B) is supported by a rotation shaft 45 rotatable by a driver device 46, and can move between a predetermined processing position (indicated by a solid line in FIG. 4) of an outer peripheral side of the wafer (W) and a standby position (indicated by a broken line in FIG. 4) retracted from above the wafer (W) to one side.

The driver device 46, the nozzle arm (42B) and the nozzle head (41B) are an example of a movement mechanism for moving the etching nozzle (411B). Without being limited to the structure illustrated in FIG. 4, the movement mechanism of the etching nozzle (411B) may also be structured to include a guide rail and a slider to linearly move the etching nozzle (411B).

The etching nozzles (411A, 411B) are respectively connected via the nozzle heads (41A, 41B) and the nozzle arms (42A, 42B) to an etching liquid supply source 701 (corresponding to the processing liquid supply source 70 of FIG. 2). The etching liquid supply source 701 is provided with a reservoir (not illustrated in the drawings) storing an etching liquid and a temperature adjustment device (not illustrated in the drawings) such as a heater for adjusting the temperature of the etching liquid in the reservoir and can supply an etching liquid adjusted to a temperature in a range of 20-70° C., for example, 50° C., to the etching nozzles (411A, 411B). At an outlet of the etching liquid supply source 701, flow rate adjustment devices (71a, 71b) for respectively adjusting flow rates of etching liquids supplied to the etching nozzles (411A, 411B) are provided. As the etching liquid, for example, SC1 (mixed solution of ammonia, hydrogen peroxide and water) or DHF (dilute hydrofluoric acid) or the like can be used.

Further, the rinse nozzles (412A, 412B) of the main nozzle device (40a) and the secondary nozzle device (40b) are also connected to a rinse liquid supply source 702 (corresponding to the processing liquid supply source 70 of FIG. 2) provided with a reservoir (not illustrated in the drawings) storing a rinse liquid. Rinse liquids at flow rates respectively adjusted by the flow rate adjustment devices (71c, 71d) can be supplied from the rinse liquid supply source 702.

The flow rate adjustment of the etching liquid and the rinse liquid, the temperature adjustment of the etching liquid, and the control of the movement of the main nozzle device (40a) and the secondary nozzle device (40b) are controlled by the control device 4.

The control unit 18 of the control device 4 is a processing unit that collectively controls the entire substrate processing system 1, and includes, for example, a microcomputer having a CPU (Central Processing Unit), a ROM (Read Only Memory), a RAM (Random Access Memory), an input/output port, and the like and various circuits. The CPU executes a program stored in the ROM using the RAM as a work area, and thereby, the control unit 18 controls operations of the devices such as the processing unit 16 and the substrate transport apparatus 13 provided in the substrate processing system 1.

The program may be recorded in a computer readable recording medium and may be installed from the recording medium to the memory unit of the control device. Examples of computer readable recording medium include a hard disk (HD), a flexible disk (FD), a compact disc (CD), a magnetic optical disc (MO), a memory card, and the like. Further, a part of or the entire control unit 18 may be formed by hardware such as ASIC (Application Specific Integrated Circuit) or FPGA (Field Programmable Gate Array).

The memory unit 19 of the control device 4 is realized, for example, using a semiconductor memory element such as a RAM, or a flash memory, or a storage device such as a hard disk, or an optical disc.

Discharge Method of Etching Liquid and Etching Amount

Figure 5A:
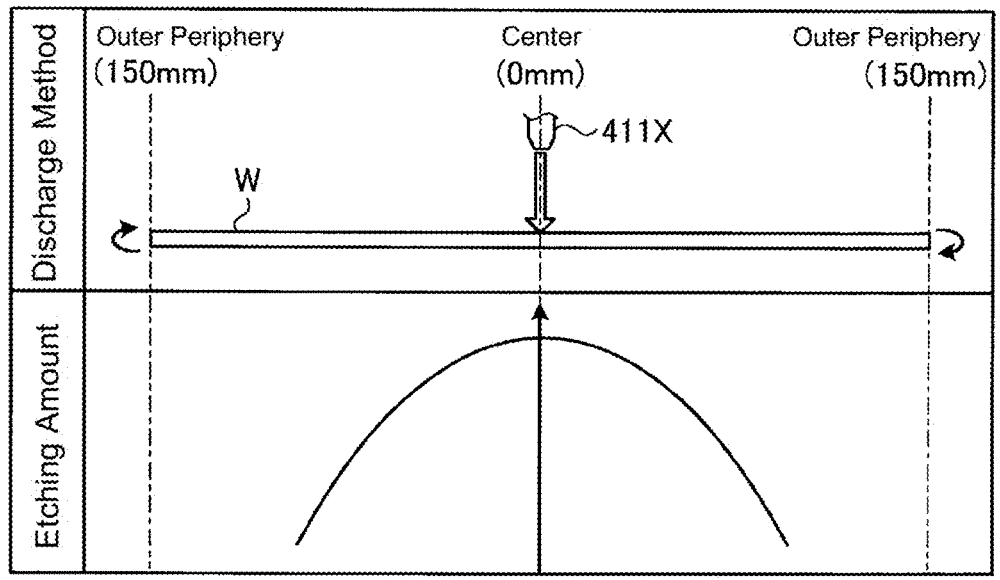
FIG. 5A schematically illustrates a relationship between a discharge method of an etching liquid and an etching amount.
Figure 5B:
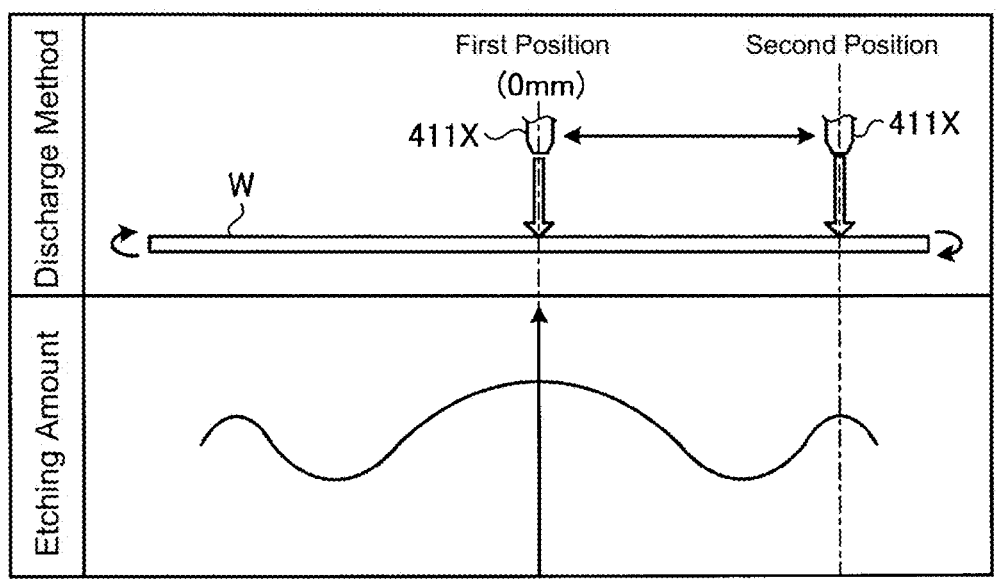
FIG. 5B schematically illustrates a relationship between a discharge method of an etching liquid and an etching amount.
Figure 5C:
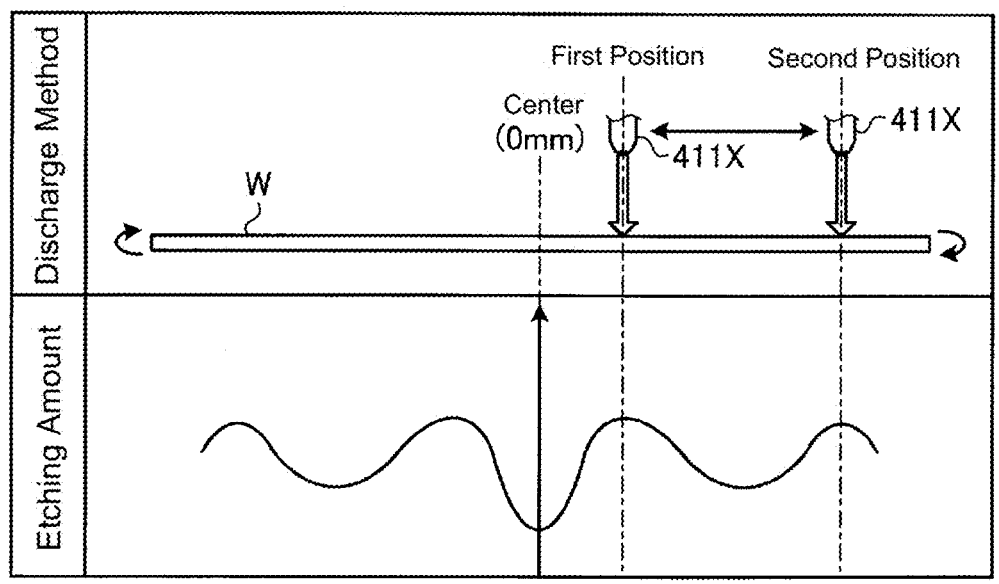
FIG. 5C schematically illustrates a relationship between a discharge method of an etching liquid and an etching amount.

A relationship between a discharge method of an etching liquid and an etching amount is described with reference to FIG. 5A-5C. FIG. 5A-5C schematically illustrate a relationship between a discharge method of an etching liquid and an etching amount. Here, the wafer (W) is assumed to have a diameter of 300 mm, and a center position of the wafer (W) is defined as at 0 mm, and an outermost peripheral position of the wafer (W) is defined as at 150 mm. Further, here, the center of the wafer (W) and a rotation center of the wafer (W) by the holding device 31 are assumed to coincide. In the following, the rotation center of the wafer (W) may be simply referred to as the center of the wafer (W).

As illustrated in FIG. 5A, when an etching liquid is discharged from a nozzle (411X) only to the center of the rotating wafer (W), the etching amount of the wafer (W) is the highest at the center of the wafer (W) and gradually decreases toward the outer peripheral side. This is because the temperature of the etching liquid is lowered toward the outer peripheral side of the wafer (W).

Therefore, in order to reduce the temperature difference of the etching liquid, as illustrated in FIG. 5B, a scan process may be used in which the nozzle (411X) is moved back and forth between a first position, at which the etching liquid is discharged to the center of the wafer (W), and a second position, which is located on an outer peripheral side of the wafer (W) relative to the first position.

According to this method, since a temperature-adjusted etching liquid is also directly supplied to the outer peripheral side of the wafer (W), the temperature difference of the etching liquid in the surface of the wafer can be reduced. Therefore, as compared to the discharge method illustrated in FIG. 5A, in-plane uniformity of the etching process can be improved.

A movement speed of the nozzle (411X) is set to a speed at which a state in which a liquid film of the etching liquid is formed at the center of the wafer (W) can be maintained, that is, a speed at which the etching liquid is supplied again to the center of the wafer (W) before the liquid film at the center of the wafer (W) disappears. Further, the number of the reciprocating operations of the nozzle (411X) is set to a number such that a desired etching amount is expected to be obtained. At the second position, since the etching amount is decreased due to a swirling flow, it is preferable to increase a supply amount of the etching liquid as compared to the first position.

As illustrated in FIG. 5C, it has also been proposed to set the first position to a position shifted from the center of the wafer (W), the first position being a turning back point on the center side of the wafer (W) among the first position and the second position that are the turning back points of reciprocating operation. According to this method, the etching amount at the center of the wafer (W) can be suppressed and the in-plane uniformity of the etching process can be further improved.

The above-described methods have room for improvement in further improving the in-plane uniformity of the etching process. That is, as in the methods illustrated in FIGS. 5B and 5C, when the nozzle (411X) is caused to move back and forth between the first position and the second position, the nozzle (411X) stops briefly at the first position and the second position in order to turn around, and thus, the supply amount of the etching liquid at the first position and the second position is larger than other positions. As a result, the etching amount at the first position and the second position is larger than the other positions and thus there is a risk that the in-plane uniformity of the etching process may be reduced. As the number of the reciprocating operations of the nozzle (411X) increases, the number of times the nozzle (411X) stops at the first position and the second position increases, and thus, the difference between the first position and the second position and the other positions increases, and the reduction in the in-plane uniformity of the etching process becomes remarkable.

In the processing unit 16 according to a first embodiment, a scan process in which the etching nozzle (411A) is moved back and forth between the first position and the second position is executed multiple times while changing the first position.

Continuous Scan Process According to First Embodiment

Figure 7A:
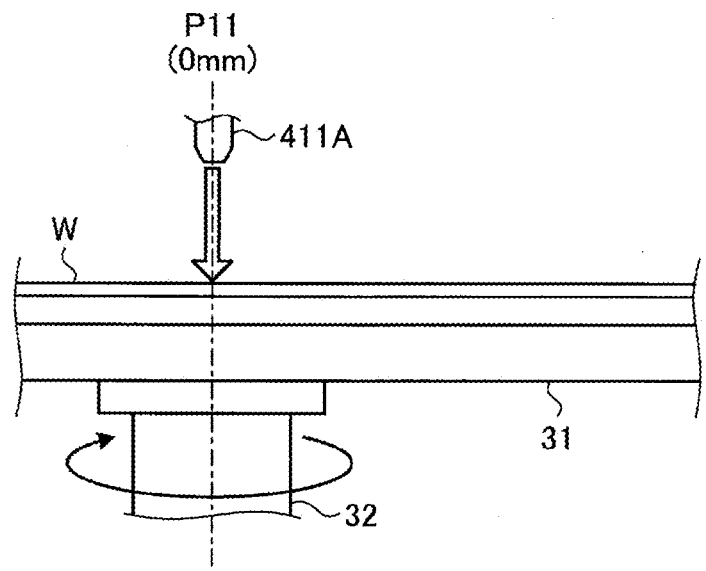
FIG. 7A illustrates a direct supply position.
Figure 7B:
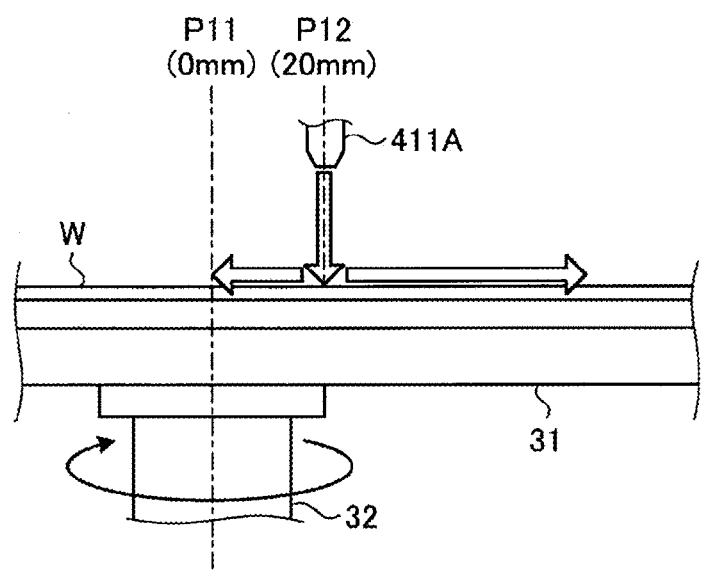
FIG. 7B illustrates an indirect supply position.
Figure 7C:
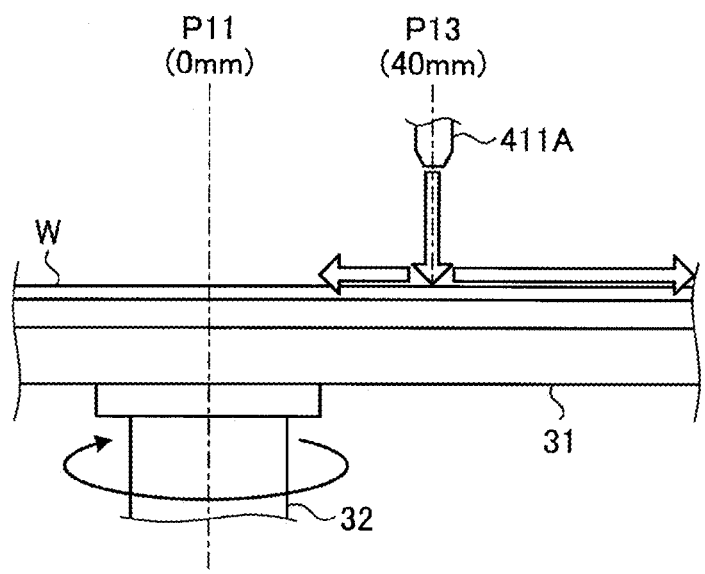
FIG. 7C illustrates a non-supply position.
Figure 8:
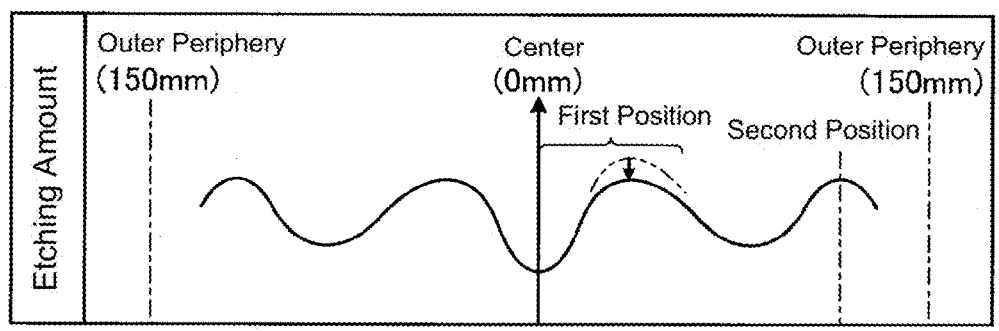
FIG. 8 schematically illustrates an etching amount when the continuous scan process according to the first embodiment has been performed.

Details of a continuous scan process according to the first embodiment are described with reference to FIG. 6-8.

Figure 6:
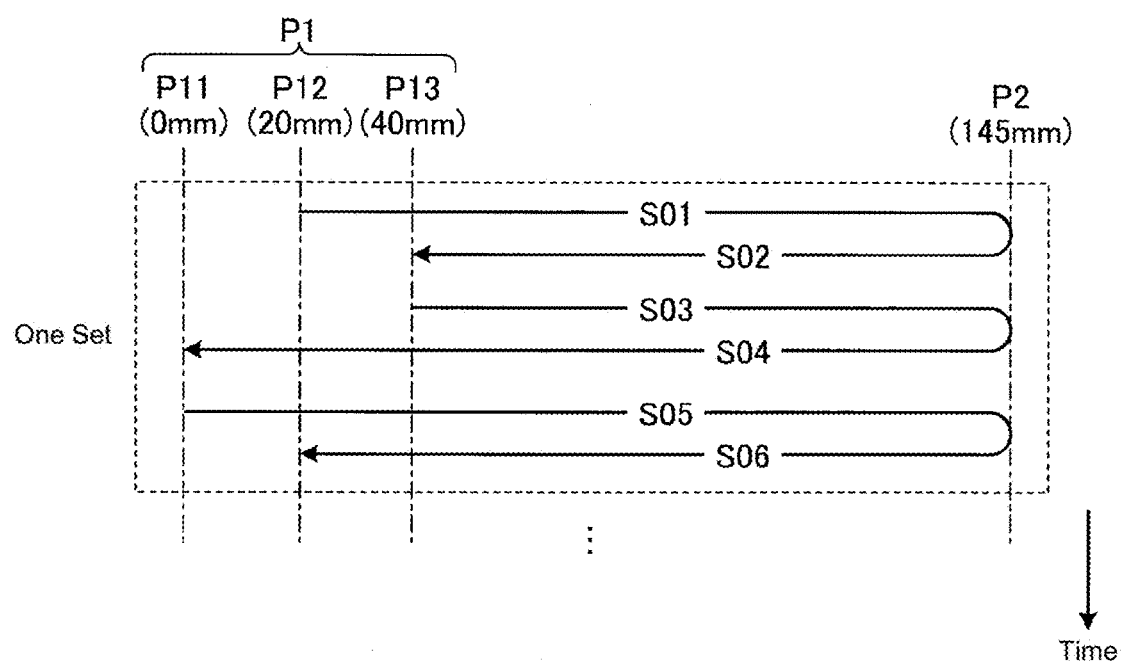
FIG. 6 is a diagram for describing details of a continuous scan process according to a first embodiment.

FIG. 6 is a diagram for describing the details of the continuous scan process according to the first embodiment. Further, FIG. 7A illustrates a direct supply position, FIG. 7B illustrates an indirect supply position, and FIG. 7C illustrates a non-supply position. Further, FIG. 8 schematically illustrates an etching amount when the continuous scan process according to the first embodiment has been performed.

Similar to FIG. 5A-5C, here, the wafer (W) is assumed to have a diameter of 300 mm, and the center position of the wafer (W) is defined as at 0 mm, and the outermost peripheral position of the wafer (W) is defined as at 150 mm.

As illustrated in FIG. 6, in the processing unit 16 according to the first embodiment, the first position (P1) is changed between the direct supply position (P11), the indirect supply position (P12) and the non-supply position (P13).

The direct supply position (P11), the indirect supply position (P12) and the non-supply position (P13) are described with reference to FIG. 7A-7C.

As illustrated in FIG. 7A, the direct supply position (P11) is a position of the etching nozzle (411A) at which the etching liquid discharged from the etching nozzle (411A) is directly supplied to the center of the wafer (W). In the first embodiment, a position at which the etching nozzle (411A) is positioned on an axis passing through the center of the wafer (W) is the direct supply position (P11).

As illustrated in FIG. 7B, the indirect supply position (P12) is a position of the etching nozzle (411A) at which the etching liquid discharged from the etching nozzle (411A) is supplied to an outer peripheral side of the wafer (W) relative to the center of the wafer (W) and the etching liquid deposited on the wafer (W) reaches the center of the wafer (W). In the first embodiment, the indirect supply position (P12) is set to a position shifted by 20 mm from the center of the wafer (W).

As illustrated in FIG. 7C, the non-supply position (P13) is a position at which the etching liquid discharged from the etching nozzle (411A) is not supplied to the center of the wafer (W), that is, a position at which the etching liquid is supplied to an outer peripheral side of the wafer (W) relative to the center of the wafer (W) and the etching liquid deposited on the wafer (W) does not reach the center of the wafer (W). The non-supply position (P13) is determined according to a rotation speed of the wafer (W) and a discharge amount of the etching liquid. In the first embodiment, the non-supply position (P13) is set to a position shifted by 40 mm from the center of the wafer (W).

In the first embodiment, the second position (P2), which is the turning back point on an outer peripheral side of the wafer (W), is set to a position shifted by 145 mm from the center of the wafer (W).

A specific operation of the continuous scan process according to the first embodiment is described below. The control unit 18 of the control device 4 first controls the driver device 33 (see FIG. 2) to rotate the holding device 31 that holds the wafer (W). Further, the control unit 18 controls the slider 43 to move the etching nozzle (411A) to the indirect supply position (P12) on the wafer (W), and thereafter causes a temperature-adjusted etching liquid to be discharged from the etching nozzle (411A). A discharge flow rate of the etching liquid is constant until the continuous scan process is completed.

After that, as illustrated in FIG. 6, the control unit 18 causes the etching nozzle (411A) to be moved from the indirect supply position (P12) to the second position (P2) (Step S01), and then, from the second position (P2) to the non-supply position (P13) (Step S02).

Subsequently, in the processing unit 16, the etching nozzle (411A) is moved from the non-supply position (P13) to the second position (P2) (Step S03), and then from the second position (P2) to the direct supply position (P11) (Step S04).

The rotation speed of the wafer (W) is set to a rotation speed capable of maintaining a state in which a liquid film of the etching liquid is formed at the center of the wafer (W) during a time period in which the etching nozzle (411A) moves from the indirect supply position (P12) and reaches the direct supply position (P11) via the second position (P2) and the non-supply position (P13). The rotation speed is determined by the discharge flow rate of the etching liquid, a movement speed of the etching nozzle (411A), and the like. In the first embodiment, the rotation speed of the wafer (W) is set to 200 rpm.

In this way, by rotating the holding device 31 at a rotation speed capable of maintaining a state in which a liquid film of the etching liquid is formed at the center of the wafer (W) during a time period in which the etching nozzle (411A) moves from the indirect supply position (P12) and reaches the direct supply position (P11) via the second position (P2) and the non-supply position (P13), it is possible to achieve in-plane uniformity of the etching process while preventing the center of the wafer (W) from being exposed from the etching liquid.

Subsequently, in processing unit 16, the etching nozzle (411A) is moved from the direct supply position (P11) to the second position (P2) (Step S05) and then from the second position (P2) to the indirect supply position (P12) (Step S06).

Thereafter, with the above-described operations of Steps S01-S06 as one set, the control unit 18 continuously executes multiple sets (for example, 70-100 times).

In this way, by dispersing the first position (P1), which is the turning back point of the reciprocating operation, to multiple positions, as compared with the method in which only one position is set as the first position (P1), it is possible to alleviate the situation where the etching liquid is concentratedly supplied to one place. Therefore, as illustrated in FIG. 8, the etching amount at the first position (P1) can be suppressed, and the in-plane uniformity of the etching process can be improved.

As described above, the control unit 18 changes the first position (P1) between the direct supply position (P11), the indirect supply position (P12), and the non-supply position (P13). In this way, by including the non-supply position (P13) in the first position (P1), for example, as compared to a case where the first position (P1) is changed only in a range where the etching liquid can reach the center of the wafer (W) (that is, the range of the direct supply position (P11)—the indirect supply position (P12)), the turning back point of the reciprocating operation on the center side of the wafer (W) can be dispersed over a wider range. Therefore, the in-plane uniformity of the etching process can be further improved.

The control unit 18 starts the first scan process of the continuous scan process from the indirect supply position (P12). As a result, for example, as compared to a case where the first scan process is started from the non-supply position (P13), the continuous scan process can be started while a liquid film of the etching liquid is formed at the center of the wafer (W).

Here, the first position is changed for each reciprocation (each time the etching nozzle (411A) reaches the second position (P2)). However, it is also possible that the control unit 18 changes the first position each time the etching nozzle (411A) reciprocates multiple times (for example, every two reciprocations).

Here, the first position (P1) is changed from the direct supply position (P11) to the indirect supply position (P12) and from the indirect supply position (P12) to the non-supply position (P13). However, it is also possible that the control unit 18 changes the first position (P1) from the indirect supply position (P12) to the direct supply position (P11) and from the direct supply position (P11) to the non-supply position (P13).

Here, the first scan process is started from the indirect supply position (P12). However, it is also possible that the control unit 18 starts the first scan process from the direct supply position (P11), or from the non-supply position (P13).

Here, the first position (P1) is changed between the direct supply position (P11), the indirect supply position (P12) and the non-supply position (P13). However, it is also possible that the control unit 18 changes the first position (P1) between any two of the direct supply position (P11), the indirect supply position (P12) and the non-supply position (P13). For example, the control unit 18 may change the first position (P1) between the indirect supply position (P12) and the non-supply position (P13), or may change the first position (P1) between the direct supply position (P11) and the indirect supply position (P12), or may change the first position (P1) between the direct supply position (P11) and the non-supply position (P13).

The change of the first position (P1) as described above can be realized, for example, by inputting a setting value by an operator via an operation screen and transmitting the input information to the control unit 18. In order to improve the in-plane uniformity of the etching process, a supply amount per unit time of the etching liquid or the rotation speed of the wafer (W) may be changed. However, according to the substrate processing system 1 of the present embodiment, by a simple setting change such as changing the first position (P1), which is the turning back point on the center side, it is possible to improve the in-plane uniformity of the etching process.

Flow of Substrate Treatment

Figure 9:
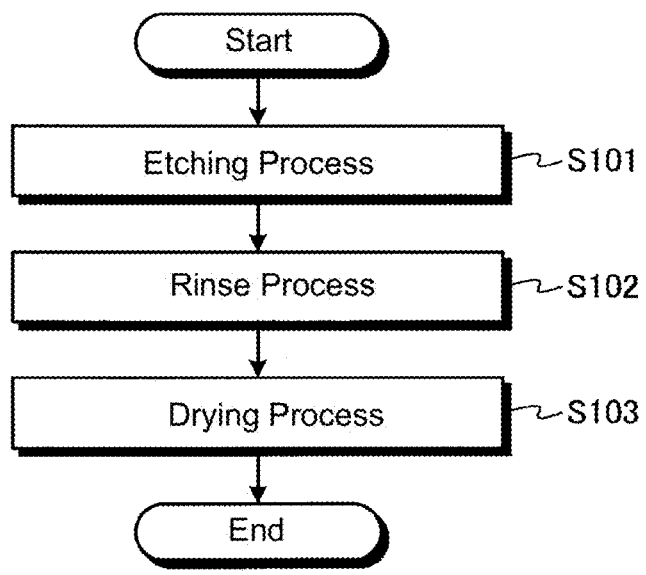
FIG. 9 is a flowchart illustrating an example of substrate treatment procedures executed by the processing unit.

FIG. 9 is a flowchart illustrating an example of substrate treatment procedures executed by the processing unit 16. The wafer (W) carried to each processing unit 16 by the substrate transfer apparatus 17 is carried into the chamber 20 via a loading and unloading port (not illustrated in the drawings). The substrate holding mechanism 30 transfers the wafer (W) to be processed from the wafer holding mechanism of the substrate transport apparatus 17 to the holding device 31 via a lift pin (not illustrated in the drawings) or the like and then retreats from the chamber 20.

When the wafer (W) is placed in the holding device 31, the holding device 31 is rotated by the driver device 33 and the main nozzle device (40a) is advanced from the standby position to the indirect supply position (P12). Further, the secondary nozzle device (40b) is moved from the standby position to an outer peripheral part of the wafer (W). Specifically, the etching nozzle (411B) of the secondary nozzle device (40b) is positioned at a position at which an etching liquid discharged from the etching nozzle (411B) is deposited at an outer peripheral part of the wafer (W), for example, at a position 140 mm from the center of the wafer (W).

When the rotation speed of the wafer (W) reaches a predetermined set speed, the etching process is started (Step S101). Specifically, an etching liquid is discharged from the etching nozzle (411A) of the main nozzle device (40a), and the above-described continuous scan process is started. Further, an outer periphery supply process is started in which an etching liquid is supplied from the etching nozzle (411B) of the secondary nozzle device (40b) to an outer peripheral part of the wafer (W).

As a result, the etching liquid discharged from the nozzle devices (40a, 40b) spreads on the surface of the rotating wafer (W) and the etching process of the wafer (W) is performed. In this case, by supplying the etching liquid using the main nozzle device (40a) moving back and forth between the center side and the outer peripheral side of the wafer (W) and the secondary nozzle device (40b) for adjusting the in-plane temperature distribution, the etching process is performed while forming a uniform in-plane temperature distribution.

In particular, in the processing unit 16 according to the first embodiment, the scan process in which the etching nozzle (411A) is moved back and forth between the first position (P1) and the second position (P2) is executed multiple times while changing the first position (P1). Therefore, it is possible to alleviate an increase in the etching amount at the turning back points of the reciprocating operation. Further, in the outer peripheral supply process, by directly supplying the etching liquid to an outer peripheral part of the wafer (W), a decrease in the temperature of the etching liquid at the outer peripheral part of the wafer (W) is suppressed, and the etching process can be performed in a state in which the in-plane temperature distribution is more uniform.

After performing the etching process of the wafer (W) for a predetermined period of time in this way, the discharge of the etching liquid from the main nozzle device (40a) and the secondary nozzle device (40b) is stopped, and a rinse liquid is discharged from the rinse nozzles (412A, 412B) of the main nozzle device (40a) and the secondary nozzle device (40b) (Step S102). Here, in a case where the in-plane temperature distribution of the wafer (W) during rinse cleaning using the rinse liquid, such as a hot rinse treatment, affects the result of the etching process, in the same manner as in the supply of the etching liquid, the rinse liquid is supplied using both the main nozzle device (40a) that moves back and forth between the first position (P1) and the second position (P2) and the secondary nozzle device (40b) for adjusting the in-plane temperature distribution.

In a case where the in-plane temperature distribution of the wafer (W) during rinse cleaning has little influence on the result of the etching process, for example, it is also possible that the main nozzle device (40a) is stopped above the center part of the wafer (W), and the rinse liquid is supplied only from the main nozzle device (40a), and the adjustment of the in-plane temperature distribution using the secondary nozzle device (40b) is not performed.

After performing rinse cleaning and shaken-off drying in this way (step S103), the rotation of the holding device 31 is stopped. Then, the wafer (W) is transferred, in procedures opposite to that at the time of loading, to the substrate transport apparatus 17 that has entered the chamber 20, and the wafer (W) is unloaded from the processing unit 16.

As described above, the substrate processing apparatus according to the first embodiment includes the holding device 31, the driver device 33 (an example of a rotation mechanism), the etching nozzle (411A) (an example of a nozzle), the slider 43 (an example of the movement mechanism), and the control unit 18. The holding device 31 horizontally holds the wafer (W) (an example of a substrate). The driver device 33 rotates the holding device 31. The etching nozzle (411A) supplies an etching liquid to the wafer (W) held by the holding device 31. The slider 43 moves the nozzle (411A). The control unit 18 controls the driver device 33 and the slider 43 to execute a scan process in which, while an etching liquid is supplied from the etching nozzle (411A) to the rotating wafer (W), the etching nozzle (411A) is moved back and forth between the first position (P1) above the wafer (W) and the second position (P2) on an outer peripheral side of the wafer (W) relative to the first position (P1). Further, the control unit 18 executes the scan process multiple times while changing the first position (P1).

According to such a processing unit 16 of the first embodiment, the situation where the etching amount at a turning back point of the reciprocating operation is larger than other positions can be alleviated. Therefore, the in-plane uniformity of the etching process can be improved.

Second Embodiment

Details of a continuous scan process according to a second embodiment are described with reference to FIGS. 10 and 11. FIG. 11 schematically illustrates an etching amount when the continuous scan process according to the second embodiment has been performed.

In the following description, a part that is the same as a part that has already been described is indicated using the same reference numeral symbol as the part that has already been described, and redundant description is omitted.

Figure 10:
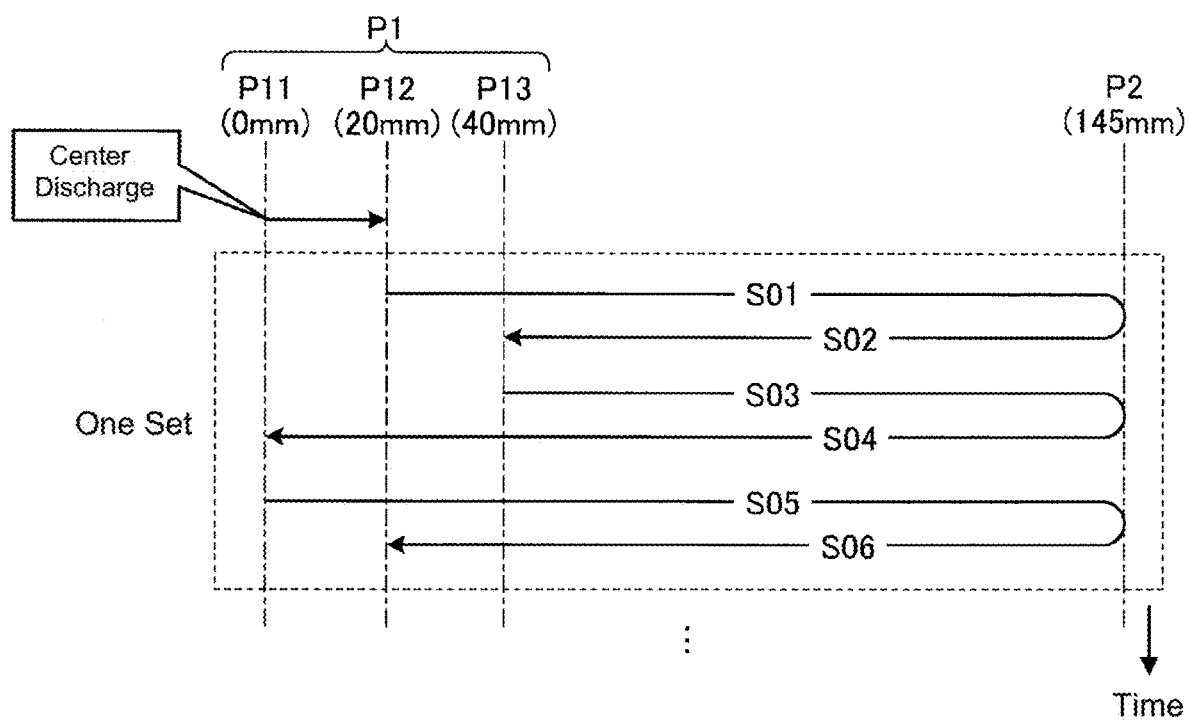
FIG. 10 is a diagram for describing details of a substrate treatment according to a second embodiment.
Figure 11:
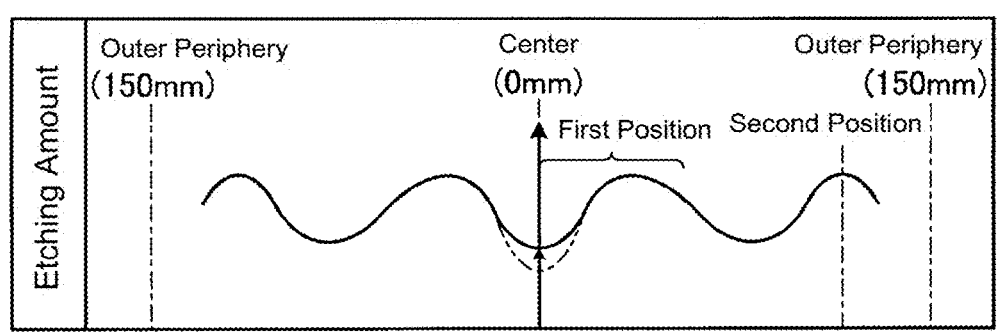
FIG. 11 schematically illustrates an etching amount when the substrate treatment according to the second embodiment has been performed.

As illustrated in FIG. 10, in the second embodiment, the control unit 18 executes a center discharge process in which the etching liquid is supplied to the center of the wafer (W) prior to the start of the above-described continuous scan process.

Specifically, the control unit 18 places the etching nozzle (411A) at the direct supply position (P11) and supplies the etching liquid from the etching nozzle (411A) to the center of the wafer (W) for a predetermined time period. The time period for discharging the etching liquid to the center of the wafer (W) is a time period longer than a time period required to spread the etching liquid supplied to the center of the wafer (W) to the entire surface of the wafer (W) by the rotation of the wafer (W), and, for example, is set to 1 second.

Thereafter, the control unit 18 moves the etching nozzle (411A) from the direct supply position (P11) to the indirect supply position (P12) while discharging the etching liquid from the etching nozzle (411A), and starts the above-described continuous scan process.

In the way, after supplying the etching liquid to the wafer (W) from the direct supply position (P11), the control unit 18 may move the etching nozzle (411A) from the direct supply position (P11) to the indirect supply position (P12) and start the first scan process.

As a result, as illustrated in FIG. 11, as compared with the case where the continuous scan process is started without performing the center discharge process, it is possible to suppress a decrease in the etching amount at the center of the wafer (W). Therefore, the in-plane uniformity of the etching process can be further improved.

When the supply of the etching liquid to the wafer (W) is started from the indirect supply position (P12), which is a position shifted from the center of the wafer (W), there is a risk that the etching liquid cannot be uniformly diffused and the etching amount of the wafer (W) may become left-right asymmetric. In contrast, according to the processing unit 16 of the second embodiment, by performing the center discharge process prior to the continuous scan process, it is possible to prevent the etching amount of the wafer (W) from becoming left-right asymmetric with respect to the center of the wafer (W).

Third Embodiment

When the etching nozzle (411A) is moved at a constant speed, the supply amount per unit area of the etching liquid gradually decreases from the center of the wafer (W) toward an outer peripheral side. Therefore, in order to make the supply amount of the etching liquid uniform on the surface of the wafer (W), the control unit 18 may reduce the movement speed of the etching nozzle (411A) from the first position (P1) toward the second position (P2). By making the supply amount of the etching liquid uniform on the surface of the wafer (W), the in-plane uniformity of the etching process can be further improved.

On the other hand, in the processing unit 16, in order to make the temperature distribution on the surface of the wafer (W) more uniform, in parallel with the continuous scan process using the etching nozzle (411A), an outer peripheral supply process is also performed in which an etching liquid is directly supplied from the etching nozzle (411B) to an outer peripheral part of the wafer (W). However, when the etching liquid is discharged from the multiple etching nozzles (411A, 411B), flows of the etching liquid collide with each other on the surface of the wafer (W), and retention of the etching liquid occurs in the outer peripheral part of the wafer (W), and there is a risk that the etching amount in the outer peripheral part of the wafer (W) may become too large.

Figure 12:
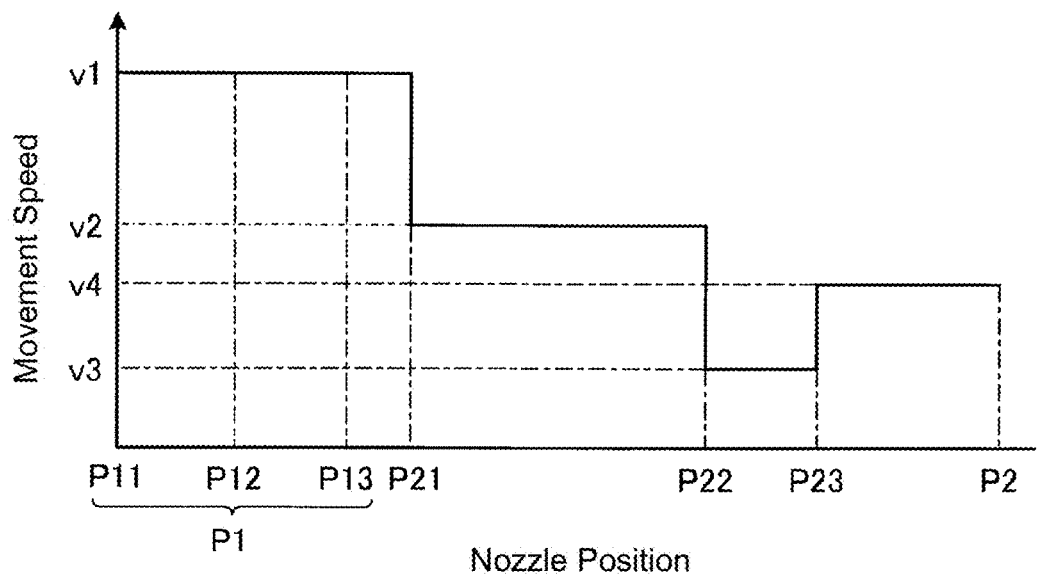
FIG. 12 illustrates a relationship between a position of an etching nozzle above a wafer and a movement speed of the etching nozzle.

Therefore, in order to prevent the retention of the etching liquid as much as possible, it is also possible that the movement speed of the etching nozzle (411A) is gradually reduced from the center of the wafer (W) toward the outer peripheral side, and, when passing through the outer peripheral part of the wafer (W), the movement speed of the etching nozzle (411A) is increased. This point is described with reference to FIG. 12. FIG. 12 illustrates a relationship between the position of the etching nozzle (411A) on the wafer (W) and the movement speed of the etching nozzle (411A).

As illustrated in FIG. 12, the control unit 18 moves the etching nozzle (411A) at a speed (vi) between the first position (P1) (the direct supply position (P11), the indirect supply position (P12) and the non-supply position (P13)) and a position (P21) on an outer peripheral side of the wafer (W) relative to the first position (P1). Further, the control unit 18 moves the etching nozzle (411A) at a speed (v2), which is slower than the speed (v1), between the position (P21) and a position (P22), which is on an outer peripheral side of the wafer (W) relative to the position (P21). Further, the control unit 18 moves the etching nozzle (411A) at a speed (v3), which is slower than the speed (v2), between the position (P22) and a position (P23), which is on an outer peripheral side of the wafer (W) relative to the position (P22).

The control unit 18 moves the etching nozzle (411A) at a speed (v4), which is faster than the speed (v3), between the position (P23) and the second position (P2).

In this way, the processing unit 16 includes the etching nozzle (411B) (an example of an outer periphery nozzle) that supplies an etching liquid to an outer peripheral part of the wafer (W). Further, the control unit 18 sets the movement speed of the etching nozzle (411A) at a third position (for example, the position (P22) or the position (P23)) on an outer peripheral side of the wafer (W) relative to the first position (P1) and on a center side of the wafer (W) relative to the second position (P2) to be slower than the movement speed of the etching nozzle (411A) at the first position (P1), and sets the movement speed of the etching nozzle (411A) at the second position (P2) to be faster than the movement speed of the etching nozzle (411A) at the third position.

As a result, an outer peripheral part of the wafer (W) can be prevented from being excessively etched by suppressing retention of the etching liquid at the outer peripheral part of the wafer (W). Further, by increasing the movement speed of the etching nozzle (411A) at the second position (P2), the etching amount around the second position (P2), which is a turning back point of the reciprocating operation, can be suppressed, and the in-plane uniformity of the etching process can be further improved.

The outer peripheral supply process does not necessarily have to be performed. When the outer peripheral supply process is not performed, that is, when the etching liquid is not supplied from the etching nozzle (411B) to an outer peripheral part of the wafer (W), the control unit 18 may continue to slow down the movement speed of the etching nozzle (411A) when the etching nozzle (411A) departs from the first position (P1) and reaches the second position (P2).

Fourth Embodiment

In order to improve in-plane uniformity of the temperature distribution of the wafer (W), the processing unit 16 may include a heating fluid supply device that supplies heating fluid to a lower surface (a surface on an opposite side of the surface to be treated) of the wafer (W) from the lower surface of the wafer (W).

Figure 13:
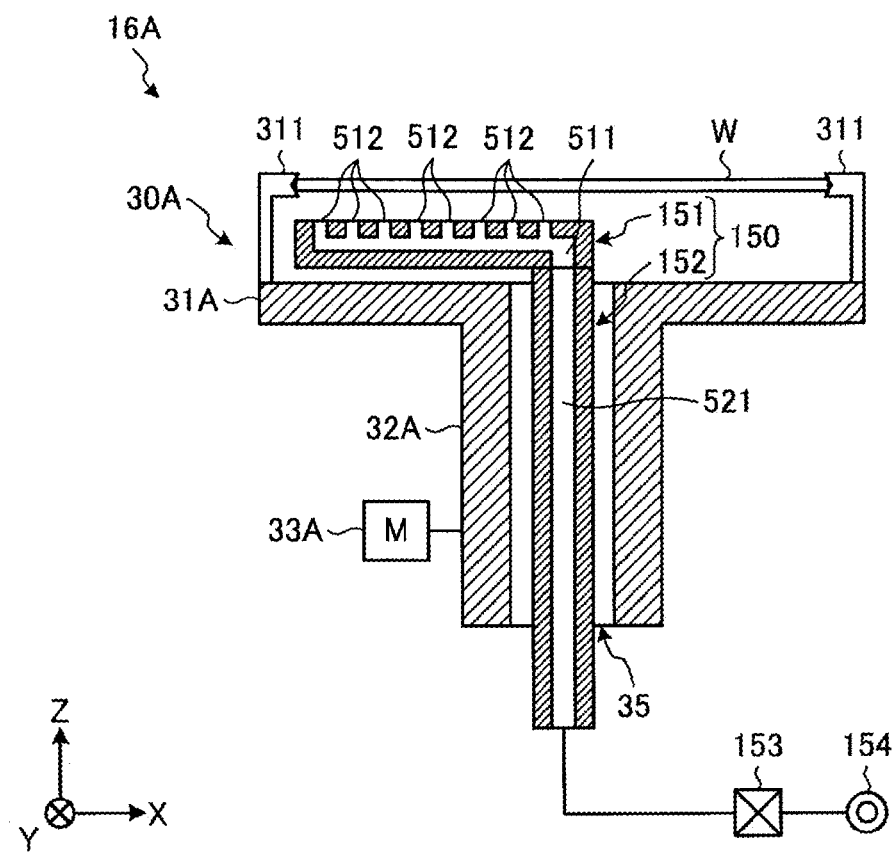
FIG. 13 illustrates a structural example of a heating fluid supply device.

FIG. 13 illustrates a structural example of the heating fluid supply device. As illustrated in FIG. 13, a processing unit (16A) according to a fourth embodiment includes a substrate holding mechanism (30A), and a heating fluid supply device 150.

The substrate holding mechanism (30A) includes a holding device (31A), a support post (32A), and a driver device (33A). The holding device (31A) is, for example, a disk-shaped member, and a holding member 311 for holding the wafer (W) from a lateral side is provided on an upper surface of the holding device (31A). The wafer (W) is horizontally held by the holding member 311 in a state of being slightly separated from the upper surface of the holding device (31A).

The support post (32A) horizontally supports the holding device (31A) at an upper end. The support post (32A) is rotated by the driver device (33A) about a vertical axis. As the support post (32A) rotates about the vertical axis, the holding device (31A) and the wafer (W) held by the holding device (31A) rotate about the vertical axis.

The substrate holding mechanism (30A) includes a hollow part 35 penetrating the holding device (31A) and the support post (32A). A support post 152 supporting the heating fluid supply device 150 to be described later is inserted through the hollow part 35.

The heating fluid supply device 150 is positioned under the wafer (W) held by the substrate holding mechanism (30A) and supplies HDIW (heated pure water) to the lower surface of the wafer (W).

The heating fluid supply device 150 includes a nozzle part 151 and a support post 152. The nozzle part 151 is an elongated member extending in a horizontal direction, and a flow path 511 extending along a longitudinal direction is provided inside the nozzle part 151. Further, the heating fluid supply device 150 includes multiple discharge ports 512 communicatively connected to the flow path 511. The multiple discharge ports 512 are positioned side by side at a predetermined interval along the flow path 511, that is, along a radial direction of the wafer (W) held by the substrate holding mechanism (30A).

The support post 152 is inserted through the hollow part 35 of the substrate holding mechanism (30A) and horizontally supports a base end part of the nozzle part 151 at an upper end. Inside the support post 152, a flow path 521 communicatively connected to the flow path 511 of the nozzle part 151 is provided. An HDIW supply source 154 is connected to the flow path 521 via a supply device group 153 including a valve, a flow rate adjustment device, and the like. HDIW supplied to the heating fluid supply device 150 is discharged from the multiple discharge ports 512 and is supplied to the lower surface of the wafer (W). A temperature of the HDIW is set to a temperature equal to or higher than the temperature of the etching liquid discharged from the etching nozzle (411A).

In this way, according to the heating fluid supply device 150, it is possible to directly supply the HDIW discharged from the multiple discharge ports 512 to substantially the entire lower surface of the wafer (W). As a result, the in-plane uniformity of the temperature distribution of the wafer (W) can be improved.

Here, the heating fluid supplied from heating fluid supply device 150 is not necessarily HDIW. For example, the processing unit (16A) may supply from the heating fluid supply device 150 the same etching liquid as the etching liquid supplied from the etching nozzle (411A). Further, the heating fluid supplied from the heating fluid supply device 150 may be a heated gas.

Fifth Embodiment

In a case where a pattern is formed on the upper surface of the wafer (W), there is a risk that, in the above-described drying process (Step S103 of FIG. 9), the pattern may collapse due to a surface tension of the processing liquid (here, the rinse liquid) remaining on the wafer (W).

A "processing time of the drying process" is a factor causing pattern collapse. For a longer processing time, pattern collapse is more likely to occur.

Figure 14:
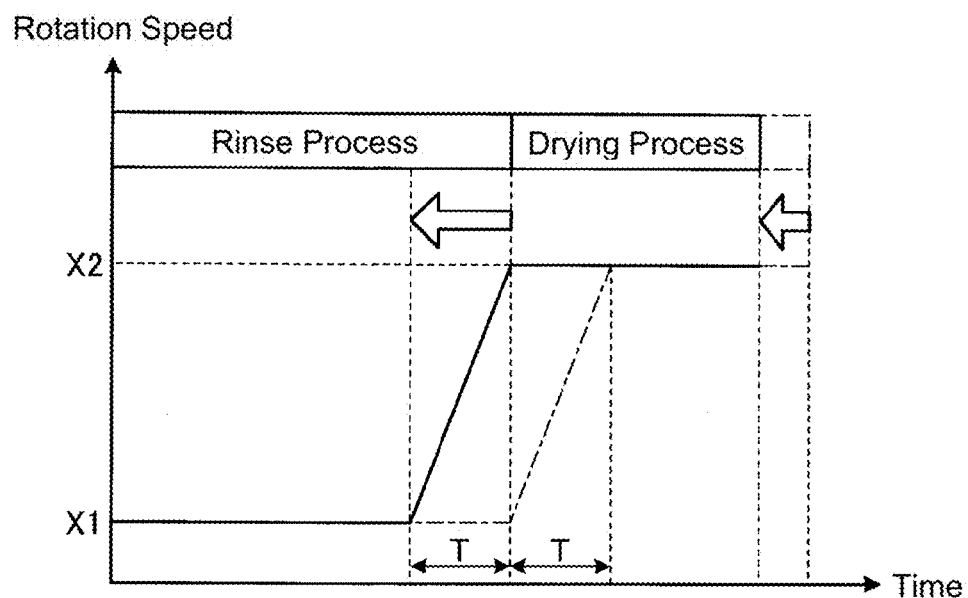
FIG. 14 is a diagram for describing the details of a drying process according to a fifth embodiment.

In order to shorten the processing time of the drying process, before the start of the drying process, in other words, before the end of the rinse process, an in-advance acceleration process in which the rotation speed of the wafer (W) is increased may be performed. This point is described with reference to FIG. 14. FIG. 14 is a diagram for describing the details of the drying process according to a fifth embodiment.

As indicated by a one-dot chain line in FIG. 14, simultaneously with the start of the drying process, the supply of the rinse liquid may be stopped and the rotation speed of the wafer (W) may be increased from a rotation speed X1 (for example, 200 rpm) of the rinse process to X2 (for example, 4000 rpm). The rotation speed X2 is a rotation speed that allows a rinse liquid remaining on the wafer (W) to be shaken off. However, in this method, the processing time of the drying process becomes extra longer by a time (T) required for the rotation speed to reach X2.

Therefore, the control unit 18 increases the rotation speed of wafer (W) before the start of the drying process. For example, the control unit 18 starts an in-advance acceleration process, in which the rotation speed of the wafer (W) is increased, at a point earlier than the start of the drying process by the time (T) required for the rotation speed of the wafer (W) to reach X2 from X1.

By doing so, it is possible that, at the beginning of the drying process, the rotation speed of the wafer (W) has already reached X2. Therefore, it is possible to shorten the processing time as compared to the drying process above. Therefore, occurrence of pattern collapse can be suppressed.

When the in-advance acceleration process is performed, there is a risk that the temperature of the wafer (W) may be lowered as compared to the case where the in-advance acceleration process is not performed. As the temperature of the wafer (W) decreases, the temperature of the processing liquid remaining on the wafer (W) also decreases. As the temperature of the processing liquid decreases, viscosity of the processing liquid increases. As the viscosity of the processing liquid increases, the surface tension increases. Therefore, by simply performing the in-advance acceleration process, to the contrary, pattern collapse may be more likely to occur.

Figure 15:
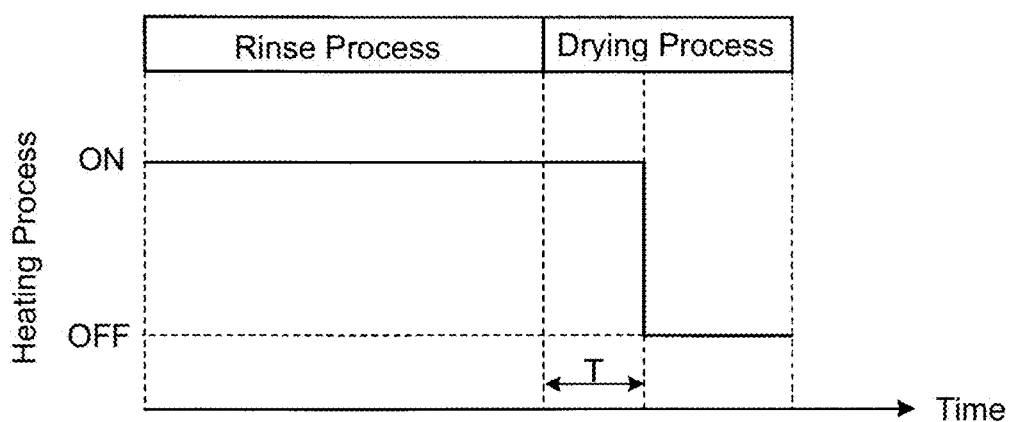
FIG. 15 is a diagram for describing details of a heating process.

The control unit 18 may perform a heating process in which, for example, the heating fluid supply device 150 described in the fourth embodiment is used to heat the wafer (W). This point is described with reference to FIG. 15. FIG. 15 is a diagram for describing details of the heating process.

As illustrated in FIG. 15, the control unit 18 supplies HDIW from the heating fluid supply device 150 to the lower surface of the wafer (W) in the rinse process. Then, the control unit 18 stops the supply of the HDIW from the heating fluid supply device 150 to the lower surface of the wafer (W) when the time (T) has elapsed since the drying process is started. The temperature of the HDIW may be a temperature such that the temperature of the wafer (W) in the case where the in-advance acceleration process is performed is equal to or higher than the temperature of the wafer (W) in the case where the in-advance acceleration process is not performed.

By heating the wafer (W) in this way, even when the temperature of the wafer (W) is lowered by performing the in-advance acceleration process, it is possible to suppress the temperature decrease of the wafer (W). Therefore, occurrence of pattern collapse can be more reliably suppressed.

Here, an example of the case where the drying process is performed after the rinse process has been described. However, in the substrate treatment, after the rinse process and before the drying process, an IPA supply process of supplying IPA to the upper surface of the wafer (W) may be performed. In this case, the in-advance acceleration process is started during the processing of the IPA supply process. Therefore, in this case, the control unit 18 may supply HDIW from the heating fluid supply device 150 to the lower surface of the wafer (W) in the IPA supply process, and, after the time (T) has elapsed since the drying process is started, stop the supply of the HDIW from the heating fluid supply device 150 to the lower surface of the wafer (W).

Without being limited to HDIW, the heating fluid supplied from the heating fluid supply device 150 may also be, for example, heated IPA or a heated gas.

Here, the heating process is terminated when the time (T) has elapsed since the drying process is started. However, the control unit 18 may terminate the heating process at least after the drying process is started. That is, the control unit 18 may terminate the heating process before the time (T) has elapsed since the start of the drying process, or may terminate the heating process after the time (T) has elapsed since the start of the drying process.

The control unit 18 may start the heating process after a process (the rinse process or the IPA supply process) immediately before the drying process is started. For example, the control unit 18 may start the heating process at a point earlier than the end of the rinse process or the IPA supply process by the time (T).

A substrate processing apparatus performing the in-advance acceleration process is not limited to the processing units (16, 16A) described in the first-fourth embodiments. A substrate processing apparatus for performing the in-advance acceleration process includes at least a holding device that holds the wafer (W), a rotation mechanism that rotates the holding device, and a nozzle that supplies a processing liquid to the wafer (W) held by the holding device. After performing liquid processing in which a processing liquid is supplied from the nozzle to the wafer (W), the substrate processing apparatus performs a drying process in which a processing liquid remaining on the wafer (W) is removed by rotating the holding device at a rotation speed higher than that during the liquid processing.

Other Embodiments

In the above-described continuous scan process, the scan process is executed multiple times while changing the first position (P1). However, it is also possible that the scan process is executed multiple times while changing not only the first position (P1) but also the second position (P2), which is the turning back point on the outer peripheral side of the wafer (W).

With respect to substrates such as semiconductor wafer and glass substrates, a substrate processing apparatus may process the substrate by supplying a processing liquid to the substrate from a nozzle positioned above the substrate while rotating the substrate, and spreading the processing liquid over the entire surface of the substrate by a centrifugal force of the substrate. In such a substrate processing apparatus, a continuous scan process may be performed in which a scan process is continuously performed multiple times in which a nozzle is moved back and forth between a first position on a center side of the substrate and a second position on an outer peripheral side of the substrate while a processing liquid is discharged from the nozzle.

Japanese Patent Laid-Open Publication No. 2015-103656 describes that when an etching process of a substrate is performed by a continuous scan process of moving back and forth between a first position and a second position, which is on an outer peripheral side, by setting the first position to a position shifted by 30 mm from a center of the substrate, an etching amount at the center of the substrate may be suppressed and in-plane uniformity may be improved.

However, in the continuous scan process, it is found that an etching amount at the first position, which is a turning back point of the reciprocating operation, is larger as compared to other positions. Therefore, Japanese Patent Laid-Open Publication No. 2015-103656 has room for further improvement in improving in-plane uniformity of the substrate treatment.

A substrate processing apparatus and a substrate processing method according to embodiments of the present invention improve the in-plane uniformity of the substrate treatment.

A substrate processing apparatus according to one aspect of embodiments includes a holding device, a rotation mechanism, a nozzle, a movement mechanism, and a control unit. The holding device horizontally holds a substrate. The rotation mechanism rotates the holding device. The nozzle supplies an etching liquid to the substrate held by the holding device. The movement mechanism moves the nozzle. The control unit controls the rotation mechanism and the movement mechanism to perform scan process in which, while an etching liquid is supplied from the nozzle to the rotating substrate, the nozzle is moved back and forth between a first position above the substrate and a second position on an outer peripheral side of the substrate relative to the first position. Further, the control unit executes the scan process multiple times while changing the first position.

According to one aspect of embodiments, the in-plane uniformity of the substrate treatment can be improved.

Obviously, numerous modifications and variations of the present invention are possible in light of the above teachings. It is therefore to be understood that within the scope of the appended claims, the invention may be practiced otherwise than as specifically described herein.

The invention claimed is:

1. A substrate processing apparatus, comprising:
   a substrate holding mechanism comprising a holding device that holds a substrate horizontally, and a support post extending vertically and supporting the holding device such that when the support post is rotated around a vertical axis of the support post, the substrate held by the holding device is rotated;
   a supply device comprising a nozzle and configured to supply an etching liquid from the nozzle to the substrate held by the holding device;
   a movement device comprising a nozzle arm holding the nozzle of the supply device, and configured to move the nozzle arm such that the nozzle of the supply device is moved with respect to the substrate held by the holding device; and
   a control device comprising circuitry configured to execute a scan process in which the circuitry controls the movement device and the supply device such that while the etching liquid is supplied from the nozzle to the substrate being rotated, the movement device moves the nozzle over the substrate from a first position to a second position on an outer peripheral side of the substrate relative to the first position, and from the second position to the first position,
   wherein the circuitry of the control device is configured to execute the scan process a plurality of times in a set of operations and change the first position each time during the plurality of times in the set such that the movement device moves the nozzle over the substrate from the first position starting the scan process to the second position and from the second position to the first position that is different from the first position starting the scan process.

2. The substrate processing apparatus of claim 1, wherein the circuitry of the control device is configured to change the first position between at least two of a direct supply position at which an etching liquid discharged from the nozzle is directly supplied to a rotation center of the substrate, an indirect supply position at which an etching liquid discharged from the nozzle is supplied to an outer peripheral side of the substrate relative to the rotation center of the substrate and the etching liquid deposited on the substrate reaches the rotation center of the substrate, and a non-supply position at which an etching liquid discharged from the nozzle is supplied to an outer peripheral side of the substrate relative to the rotation center of the substrate and the etching liquid deposited on the substrate does not reach the rotation center of the substrate.

3. The substrate processing apparatus of claim 2, wherein the circuitry of the control device is configured to change the first position between the direct supply position, the indirect supply position and the non-supply position.

4. The substrate processing apparatus of claim 3, wherein the circuitry of the control device is configured to execute the set of operations in a plurality such that each set includes an operation in which the nozzle is moved from the direct supply position to the second position and then from the second position to one of the indirect supply position and the non-supply position, an operation in which the nozzle is moved from one of the indirect supply position and the non-supply position to the second position and then from the second position to the other one of the indirect supply position and the non-supply position, and an operation in which the nozzle is moved from the other one of the indirect supply position and the non-supply position to the second position and then from the second position to the direct supply position.

5. The substrate processing apparatus of claim 4, wherein the circuitry of the control device is configured to start a first scan process of the plurality of scan processes from the indirect supply position.

6. The substrate processing apparatus of claim 5, wherein the circuitry of the control device is configured to supply the etching liquid to the substrate from the direct supply position, then moves the nozzle from the direct supply position to the indirect supply position and start the first scan process.

7. The substrate processing apparatus of claim 3, wherein the circuitry of the control device is configured to start a first scan process of the plurality of scan processes from the indirect supply position.

8. The substrate processing apparatus of claim 7, wherein the circuitry of the control device is configured to supply the etching liquid to the substrate from the direct supply position, then move the nozzle from the direct supply position to the indirect supply position and start the first scan process.

9. The substrate processing apparatus of claim 1, wherein the circuitry of the control device is configured to reduce a movement speed of the nozzle as the nozzle is moved from the first position toward the second position.

10. The substrate processing apparatus of claim 9, wherein the supply device comprises an outer periphery nozzle and is configured to supply the etching liquid from the outer periphery nozzle to an outer peripheral portion of the substrate, and the circuitry of the control device is configured to set a movement speed of the nozzle at a third position, which is on an outer peripheral side of the substrate relative to the first position and is on a rotation center side of the substrate relative to the second position, to be slower than a movement speed of the nozzle at the first position, and set a movement speed of the nozzle at the second position to be faster than a movement speed of the nozzle at the third position.

* * * * *